United States Patent
Wang et al.

(10) Patent No.: US 9,537,467 B2
(45) Date of Patent: Jan. 3, 2017

(54) ACTIVE FILTERING SYSTEM

(71) Applicant: Schneider Electric Industries SAS, Rueil Malmaison (FR)

(72) Inventors: Miao-Xin Wang, Montbonnot Saint Martin (FR); Alain Dentella, Beaucroissant (FR); Rajesh Ghosh, Bangalore (IN)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 0 days.

(21) Appl. No.: 15/076,700

(22) Filed: Mar. 22, 2016

(65) Prior Publication Data
US 2016/0301387 A1    Oct. 13, 2016

(30) Foreign Application Priority Data
Apr. 8, 2015    (FR) ..................... 15 52997

(51) Int. Cl.
*H03K 5/00*    (2006.01)
*H03H 11/04*    (2006.01)
*H03K 17/687*    (2006.01)

(52) U.S. Cl.
CPC ........ *H03H 11/0405* (2013.01); *H03K 17/687* (2013.01)

(58) Field of Classification Search
CPC .......................... H03H 11/0405; H03H 17/687
USPC .................. 327/530–531, 551–559
See application file for complete search history.

(56) References Cited

U.S. PATENT DOCUMENTS

| | | |
|---|---|---|
| 5,132,894 A | 7/1992 | Rozman et al. |
| 5,548,165 A | 8/1996 | Mohan et al. |
| 5,693,988 A | 12/1997 | Bettega et al. |
| 5,982,648 A | 11/1999 | Wang |
| 5,999,422 A | 12/1999 | Goransson et al. |

(Continued)

FOREIGN PATENT DOCUMENTS

| | | |
|---|---|---|
| DE | 36 12 380 A1 | 10/1987 |
| GB | 2 248 981 | 4/1992 |

(Continued)

OTHER PUBLICATIONS

French Preliminary Search Report issued Jan. 27, 2016 in French Application 15 52997, filed on Apr. 8, 2015 ( with English Translation of Categories of Cited Documents and Written opinion).

*Primary Examiner* — Dinh T Le

(74) *Attorney, Agent, or Firm* — Oblon, McClelland, Maier & Neustadt, L.L.P.

(57) ABSTRACT

An active filtering system arranged for being connected between a first power supply line and a second power supply line of a DC bus, the bus being arranged for being connected to a DC voltage source located upstream, the system including a first capacitor arranged for being connected both to the first power supply line of the bus and to the second power supply line of the bus and to the terminals whereof a voltage is applied including an AC component, a switching assembly controlled by a processor for generating a compensation voltage, opposite to the AC component of the voltage at the terminals of the first capacitor, and including a first terminal connected to the first capacitor and a second terminal intended to be connected to the second power supply line.

6 Claims, 2 Drawing Sheets

(56) References Cited

U.S. PATENT DOCUMENTS

| | | |
|---|---|---|
| 6,140,866 A | 10/2000 | Wang |
| 6,583,999 B1 | 6/2003 | Spindler et al. |
| 7,881,079 B2 | 2/2011 | Prasad et al. |
| 8,116,105 B2 | 2/2012 | Klikic et al. |
| 8,522,057 B2 * | 8/2013 | Kreiner .................. G06F 1/266 439/330 |
| 8,674,548 B2 * | 3/2014 | Mumtaz ............ H01L 31/02021 307/109 |
| 9,293,248 B2 * | 3/2016 | Torres ..................... H01F 38/00 |

FOREIGN PATENT DOCUMENTS

| | | |
|---|---|---|
| WO | WO 96/02969 A1 | 2/1996 |
| WO | WO 2007/090481 A2 | 8/2007 |

\* cited by examiner

ACTIVE FILTERING SYSTEM

TECHNICAL FIELD OF THE INVENTION

The present invention relates to an active filtering system. This system is intended to be connected to a DC voltage source located upstream.

PRIOR ART

Single-phase inverters are commonly used in voltage converters for applications such as Uninterruptible Power Supplies (UPS) or in the field of photovoltaics.

In these applications, a DC power supply bus including two power supply lines is connected upstream to a DC voltage source, e.g. photovoltaic panels or a battery, and downstream to a controlled inverter for generating a variable voltage with an electrical load. A filtering solution is used for controlling the voltage variations present at the input. Usually, for avoiding these voltage variations, one or more filtering capacitors are connected to the first power supply line and the second power supply line of the bus. The total capacitance of the capacitors must be sufficient to absorb the input voltage ripples. The capacitors are often of the chemical type and have a large space requirement, are expensive and have a limited life span. To overcome these drawbacks, active filtering systems have been provided.

Patent application US2014/369090 describes an active filtering system intended to be connected to a DC voltage source located upstream and an inverter located downstream and connected to a load. The system is connected in series on the DC power supply bus. This prior art solution has several drawbacks, including:
- the presence of a very large voltage ripple at the output of the DC power supply bus (Vout1 in FIG. 1 of the document),
- the need for the active filtering system to use transistors that withstand the voltage of the DC power supply bus, making the solution expensive, complex and generating high losses, the transistors of the system having to be controlled with power supplies and insulated gate control circuits,
- since the system is directly connected in series on the DC power supply bus, the need to dimension most of the components to withstand the maximum current of the load, causing high losses and increasing the overall cost of the solution.

Patents U.S. Pat. No. 5,999,422 and U.S. Pat. No. 6,583,999B1 describe active filtering systems.

The purpose of the invention is to provide an active filtering system intended to be connected to a DC power supply bus, which is particularly compact, low in cost and generates limited losses.

DISCLOSURE OF THE INVENTION

This purpose is achieved by an active filtering system arranged for being connected between a first power supply line and a second power supply line of a DC bus, said bus being arranged for being connected to a DC voltage source located upstream, said system comprising:
- a first capacitor arranged for being connected both to the first power supply line of the bus and to the second power supply line of the bus and to the terminals whereof a voltage is applied including an AC component,
- a switching assembly controlled by processing means for generating a compensation voltage, opposite to the AC component of the voltage at the terminals of the first capacitor, and including a first terminal connected to the first capacitor and a second terminal intended to be connected to the second power supply line,
- processing means including:
  - an input for receiving said voltage at the terminals of the first capacitor,
  - means for determining said AC component of the voltage at the terminals of the first capacitor,
  - means for determining a reference value from said AC component,
  - means for determining control commands to be applied to the switching assembly for generating said compensation voltage, opposite to the AC component of the voltage at the terminals of the first capacitor and corresponding to said reference value.

According to a first embodiment, the switching assembly comprises a first transistor, a second transistor connected both to the first transistor and to the second terminal thereof, and an inductor connected to the first terminal thereof and to a connection midpoint located between the two transistors and a second capacitor connected both to the second terminal and to the first transistor.

According a second embodiment, the switching assembly includes:
- a first transistor, a second transistor connected in series to the first transistor and an inductor connected to the first terminal thereof and to a connection midpoint located between the two transistors,
- a second capacitor connected in parallel with the two transistors,
- a third transistor and a fourth transistor connected in series and in parallel with the second capacitor, the midpoint located between the third transistor and the fourth transistor being connected to the second terminal thereof.

According to one feature, the system of the invention comprises a third capacitor connected to the first terminal of the switching assembly and to the second terminal of the switching assembly.

BRIEF DESCRIPTION OF THE FIGURES

Other features and advantages will appear in the detailed description that follows made with reference to the accompanying drawings in which.

DETAILED DESCRIPTION OF AT LEAST ONE EMBODIMENT

The invention relates to an active filtering system intended to be connected on a DC power supply bus, said bus including a first power supply line 10, e.g. with a positive electric potential and a second power supply line 11, e.g. with a negative electrical potential. Said DC power supply bus is, for example, connected to a DC voltage source, e.g. one or more photovoltaic panels or a battery. The DC voltage supplied by the bus is, for example, applied at the input of a (DC/AC) inverter comprising transistors controlled for generating a variable voltage with an electrical load C.

The active filtering system AF of the invention comprises:
- a first capacitor C1 arranged for being connected both to the first power supply line 10 of the bus and to the second power supply line 11 of the bus and to the terminals whereof a voltage $V_{C1}$ is applied including an AC component,
- a switching assembly SW arranged for generating a compensation voltage $V_{AF}$, opposite to the AC component of the voltage at the terminals of the first capacitor C1, and including a first terminal B1 connected to the first capacitor C1 and a second terminal B2 intended to be connected to the second power supply line 11,
- processing means whereof the various means notably used for controlling the switching assembly will be detailed below in the description of the operation of the system.

The switching assembly SW must be controlled so that the equivalent capacitance of the active filtering system is the highest possible. The equivalent capacity Ceq is actually:

$Ceq = C_1/(1-k)$ with $C_1$ the capacitance of the first capacitor C1 and k a compensation gain.

Based on this relationship, it is understood that for a value of k close to 1, less than 1, but not equal to 1, the equivalent capacitance will be very high, enabling the filtering to be considerably improved at the ripple frequency of the input voltage.

Figure 1:
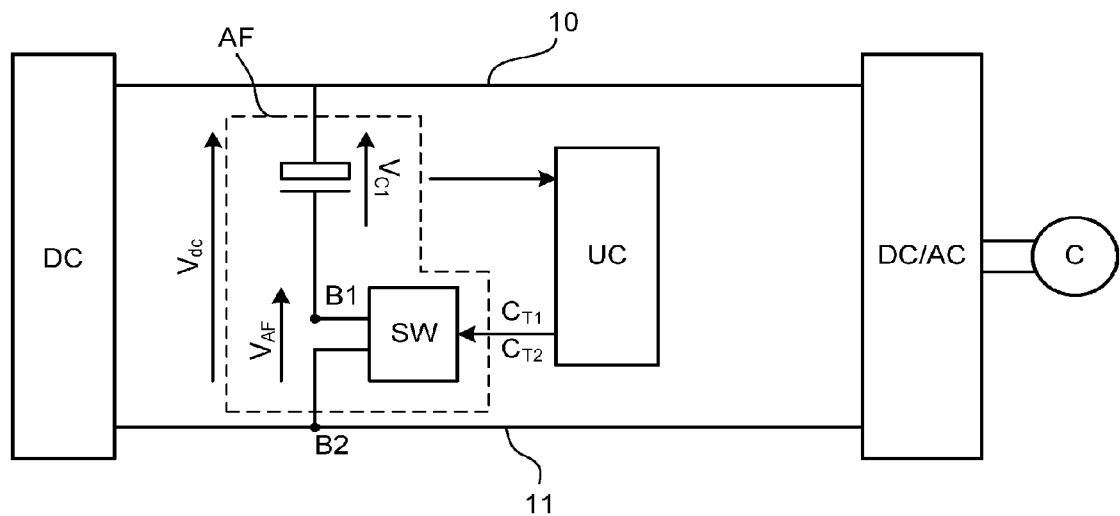
FIG. 1 represents, schematically, the architecture of the active filtering system of the invention.
Figure 2:
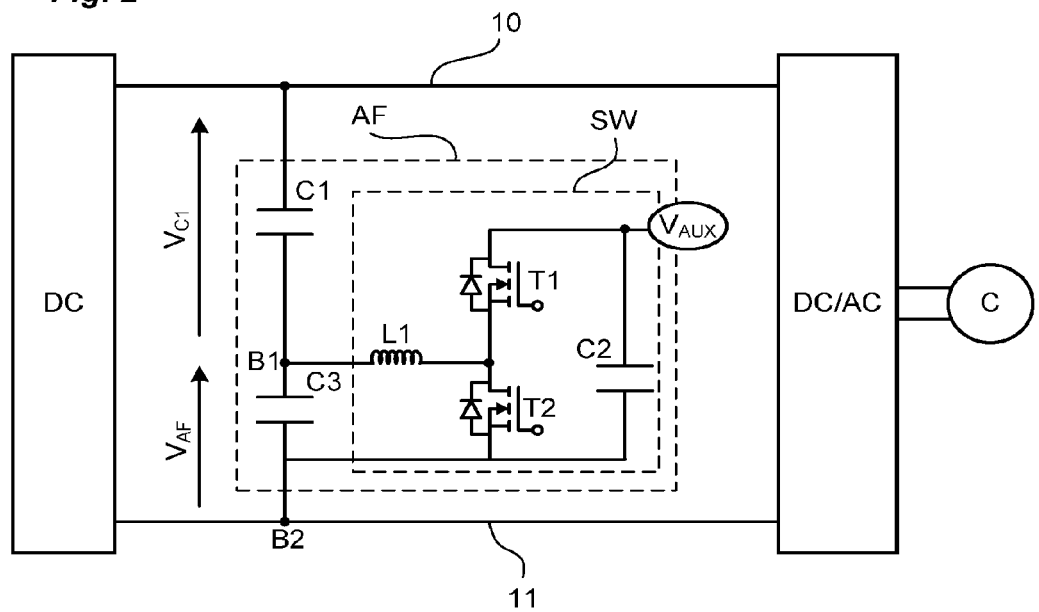
FIG. 2 represents an electronic diagram of an example of embodiment of the active filtering system of the invention.

FIG. 1 illustrates the operating principle of the active filtering system of the invention. The switching assembly SW is controlled so as to generate a voltage $V_{AF}$ being added to the voltage $V_{C1}$ at the terminals of the first capacitor C1 with a view to acting on the voltage Vdc of the DC power supply bus resulting from the sum of the voltages $V_{AF}$ and $V_{C1}$.

According to the value of the voltage $V_{C1}$ at the terminals of the first capacitor C1, processing means UC extract the oscillations of this voltage then determine the control signals $C_{T1}$, $C_{T2}$, e.g. of the PWM (Pulse Width Modulation) type, to apply to the switching assembly SW to compensate for these oscillations.

Figure 3:
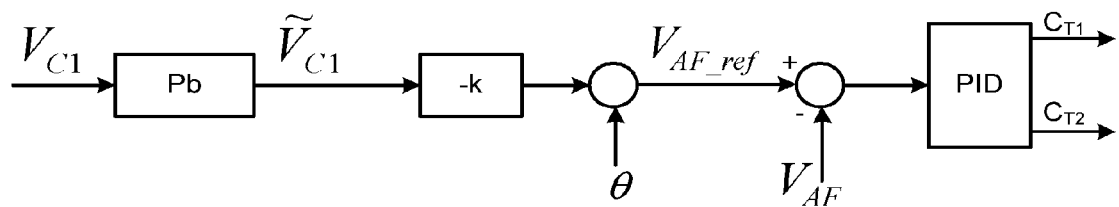
FIG. 3 represents the control synoptic of the switching assembly used in the active filtering system of the invention.

More precisely, referring to FIG. 3, the operating principle is as follows:

In a first step, the voltage $V_{C1}$ measured by conventional measuring means is sent onto an input of the processing means and filtered by the processing means UC with the aid of a bandpass filter Pb with a view to blocking its DC component and its high-frequency ripples and keeping only its AC component $\tilde{V}_{C1}$.

In a second step, the processing means UC are arranged for applying a gain to the AC component $\tilde{V}_{C1}$ of the voltage with a view to adjusting the degree of compensation. The gain is preferably—k, k having a value close to 1 but still less than 1 so that the solution remains stable.

After application of an offset θ to a third step, the processing means implement a module for determining a reference value $V_{AF\_ref}$ to be expected for the voltage at the terminals of the switching assembly SW.

In a fourth step, the processing means implement a control loop into which the reference value $V_{AF\_ref}$ is injected. The control loop consists of determining the difference between the reference value $V_{AF\_ref}$ to be expected and a value $V_{AF}$ of the voltage measured by conventional measuring means at the terminals of the switching assembly SW. The difference obtained is injected into a controller of the processing means, e.g. a proportional-integral-derivative (PID) controller. At the output of the control loop, the processing means determine the control commands $C_{T1}$, $C_{T2}$ to apply to the switching assembly SW so that the voltage $V_{AF}$ at the terminals of the switching assembly attains the reference value $V_{AF\_ref}$. The control orders $C_{T1}$, $C_{T2}$ are complementary, i.e. the transistors T1 and T2 are never in the closed state at the same time. When the transistor T1 is ordered to the closed state (the transistor T2 is then in the open state), it conducts the current and the voltage $V_{AF}$ increases and tends towards the value of $V_{AUX}$. When the transistor T2 is ordered to the closed state (the transistor T1 is then in the open state), it conducts the current and the voltage $V_{AF}$ decreases to tend towards 0.

Advantageously, the switching assembly comprises a first transistor T1 and a second transistor T2. The second transistor T2 is connected to the second terminal B2 of the switching assembly SW and to the first transistor T1. It also comprises an inductor L1 connected both to the first terminal B1 of the switching assembly and to the midpoint located between the two transistors T1, T2. It also comprises a capacitor C2, designated the second capacitor, connected to the first transistor T1 and to the second terminal B2 of the switching assembly SW. The assembly formed by the two transistors T1, T2 and the inductor L1 operates as a power amplifier used to generate the voltage $V_{AF}$ intended to compensate for the AC component $\tilde{V}_{C1}$ of the voltage $V_{C1}$ at the terminals of the first capacitor C1. The second capacitor C2 is used to create an electrical potential $V_{AUX}$ with respect to the second power supply line 11 of the DC bus for supplying the power amplifier of the switching assembly SW. The role of the second capacitor C2 is notably to absorb the variation in power and to limit the variation in the potential Vaux.

Preferably, the power amplifier may comprise a capacitor C3, designated the third capacitor which, in collaboration with the inductor L1, smooths the voltage $V_{AF}$ generated by the switching of the two transistors T1, T2. This third capacitor C3 is connected between the first terminal B1 and the second terminal B2 of the switching assembly SW.

The transistors T1, T2 are dimensioned to withstand the voltage Vaux. Typically, the voltage Vaux may be in the order of $1/20^{th}$ of the voltage Vdc of the DC power supply bus. The switching assembly formed by the transistors T1, T2 and the inductor L1 are dimensioned for supporting a current of the order of the peak value of the AC component of the load current.

Since the voltage $V_{Aux}$ to be supported is low, the transistors T1 and T2 may be of the low voltage MOSFET type, with the advantage of switching at very high frequency (a hundred or so kHz, up to MHz) and of having very low losses in conduction (very low RDson of the order of a milliohm) and in switching. The inductor L1 may thus have a low value.

Figure 4:
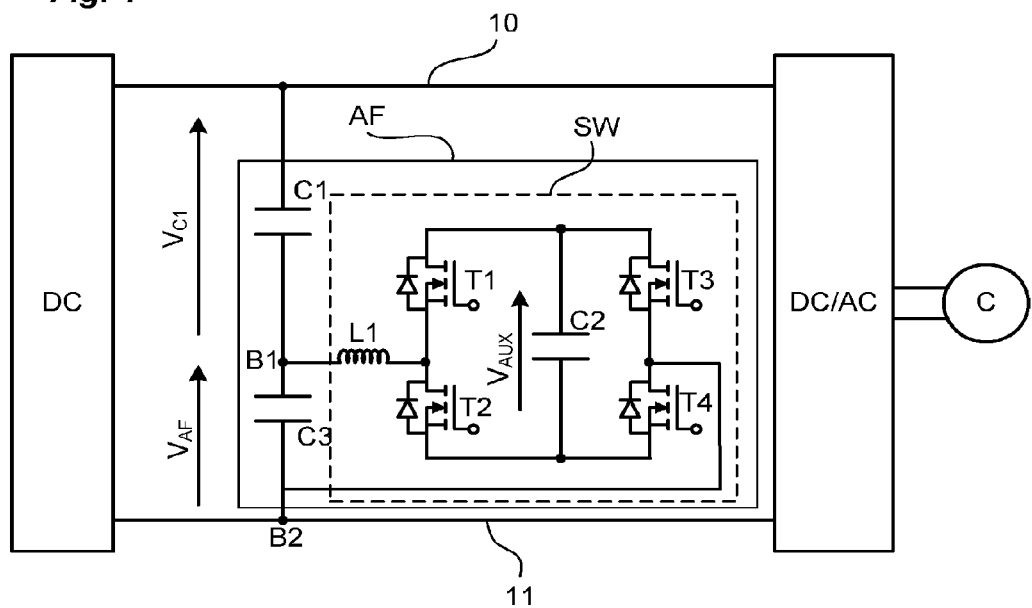
FIG. 4 represents a variant embodiment of the switching assembly used in the active filtering system of the invention.

FIG. 4 represents a variant embodiment of the switching assembly SW used in the active filtering system AF of the invention. In this second topology, the switching assembly SW comprises two additional transistors T3, T4 connected in parallel with the second capacitor C2. Moreover, the second terminal B2 of the switching assembly SW is no longer connected to the second capacitor C2 and to the second transistor T2 but to the midpoint located between the two transistors T3, T4. As in the previous topology, the third capacitor C3 may be provided and connected between the first terminal B1 and the second terminal B2. This second topology is notably used to reduce the voltage $V_{AUX}$ applied to the second capacitor C2 and can be used for generating an AC voltage, in replacement of the DC power supply bus.

The solution of the invention thus offers several advantages, including:

Limited spatial requirement,

Reduced losses,

Moderate cost,

Easy installation and reliable operation.

The invention claimed is:

1. An active filtering system connected between a first power supply line and a second power supply line of a direct current (DC) bus that is connected to a DC voltage source located upstream of the active filtering system, said active filtering system comprising:
  a first capacitor connected to the first power supply line of the DC bus and to the second power supply line of the DC bus, terminals of the first capacitor receiving a voltage that includes an alternating current (AC) component;
  a switching assembly including a first terminal connected to the first capacitor and a second terminal connected to the second power supply line of the DC bus; and
  including a processing circuit configured to:
  receive said voltage at the terminals of the first capacitor,
  determine said AC component of the voltage at the terminals of the first capacitor,
  determine a reference value from said AC component, and
  determine control commands to be applied to the switching assembly for generating a compensation voltage, opposite to the AC component of the voltage at the terminals of the first capacitor and corresponding to said reference value.

2. The system according to claim 1, wherein the switching assembly comprises a first transistor, a second transistor connected to the first transistor and to the second terminal of the switching assembly, an inductor connected to the first terminal of the switching assembly and to a connection midpoint located between the first and second transistors, and a second capacitor connected to the second terminal of the switching assembly and to the first transistor.

3. The system according to claim 1, wherein the switching assembly comprises:
  a first transistor, a second transistor connected in series to the first transistor and an inductor connected to the first terminal of the switching assembly and to a connection midpoint located between the first and second transistors,
  a second capacitor connected in parallel with the first and second transistors,
  a third transistor and a fourth transistor connected in series and in parallel with the second capacitor, a midpoint located between the third transistor and the fourth transistor being connected to the second terminal of the switching assembly.

4. The system according to claim 2, comprising a third capacitor connected to the first terminal of the switching assembly and to the second terminal of the switching assembly.

5. The system according to claim 1, wherein the processing circuit includes a proportional-integral-derivative (PID) controller that outputs the control commands based on the reference value and the compensation voltage.

6. The system according to claim 5, wherein the PID controller outputs the control commands based on a difference between the compensation voltage and the reference value.

* * * * *